US007029560B2

(12) United States Patent
Fujii et al.

(10) Patent No.: US 7,029,560 B2
(45) Date of Patent: Apr. 18, 2006

(54) ROD TARGET FOR ARC EVAPORATION SOURCE, MANUFACTURING METHOD THEREFOR, AND ARC DEPOSITION DEVICE

(75) Inventors: Hirofumi Fujii, Takasago (JP); Ryouji Miyamoto, Takasago (JP); Katuhiko Shimojima, Takasago (JP)

(73) Assignee: Kabushiki Kaisha Kobe Seiko Sho (Kobe Steel, Ltd.), Kobe (JP)

( * ) Notice: Subject to any disclaimer, the term of this patent is extended or adjusted under 35 U.S.C. 154(b) by 131 days.

(21) Appl. No.: 10/662,280

(22) Filed: Sep. 16, 2003

(65) Prior Publication Data

US 2004/0055884 A1 Mar. 25, 2004

(30) Foreign Application Priority Data

Sep. 19, 2002 (JP) ............................ 2002-273880

(51) Int. Cl.
*C23C 14/34* (2006.01)

(52) U.S. Cl. ............................ 204/298.12; 204/298.41

(58) Field of Classification Search ........... 204/298.12, 204/298.41

See application file for complete search history.

(56) References Cited

U.S. PATENT DOCUMENTS 3,400,070 A * 9/1968 Naff ...................... 422/186.03
4,505,947 A * 3/1985 Vukanovic et al. ......... 427/452

FOREIGN PATENT DOCUMENTS

| | | | |
|---|---|---|---|
| EP | 0 658 634 | | 6/1995 |
| EP | 1 081 247 A2 | | 8/2000 |
| JP | 52-95581 | * | 8/1977 |
| JP | 7-173617 | | 7/1995 |
| JP | 2000-80466 | | 3/2000 |

OTHER PUBLICATIONS

English translation of JP 6-220617.*
Patent Abstracts of Japan, JP 52-095581, Aug. 11, 1977.
Patent Abstracts of Japan, JP 06-220617, Aug. 8, 1994.

* cited by examiner

*Primary Examiner*—Steven Versteeg
(74) *Attorney, Agent, or Firm*—Oblon, Spivak, McClelland, Maier & Neustadt, P.C.

(57) ABSTRACT

In the rod target for an arc evaporation source, of which the outer peripheral surface is used as an evaporation surface, the opposite ends thereof in the longitudinal direction thereof are each formed thicker than the central part thereof. The length of the thicker portion at each of the opposite ends in the longitudinal direction is set to be not less than 75 mm nor more than 200 mm. Work with a uniform film thickness is provided, and the availability of a rod target is improved, thereby preventing the rod target from going to waste.

11 Claims, 10 Drawing Sheets

FILM THICKNESS DISTRIBUTION WHEN UPPER AND LOWER ENDS OF TARGET ARE CONSUMED TWICE AS MUCH AS CENTRAL PORTION AS SHOWN IN FIG.13 : ±3.3%

FILM THICKNESS DISTRIBUTION WHEN TARGET IS UNIFORMLY CONSUMED ALONG AXIAL DIRECTION AS SHOWN IN FIG.14 : ±19.7%

ROD TARGET FOR ARC EVAPORATION SOURCE, MANUFACTURING METHOD THEREFOR, AND ARC DEPOSITION DEVICE

BACKGROUND OF THE INVENTION

1. Field of the Invention

The present invention relates to a rod target for an arc evaporation source used for anti-wear coating treatment with respect to cutting tools, mechanical components and the like, a manufacturing method therefor, and an arc deposition device.

2. Description of the Related Art

As shown in FIG. 12, an example of a conventional vacuum arc deposition device is such that a rod target 52 for an arc evaporation source, and work 53 are provided in a vacuum vessel 51; the cathode of an arc power supply 54 is connected to the rod target 52 to input a current to the rod target 52; a target material is evaporated from the outer peripheral surface of the rod target 52 by changing the current balance; and the evaporated target material is caused to adhere to the work 53 (for example, see Japanese Unexamined Patent Application Publication No. 07-173617).

In actuality, however, when attempting to obtain a uniform film thickness by such conventional arts, if the height of the work 53 and that of the target 52 are relatively close to each other, the amount of evaporation of the target material from the opposite ends of the rod target 52 must be increased as shown in FIG. 13, in order to achieve a uniform film thickness substantially over the entire length of the work 53 as shown in FIG. 15. Also, as shown in FIG. 14, if the rod target 52 is uniformly evaporated along the longitudinal direction thereof, the region in which a uniform film thickness is attained on the work 53 is limited to a very narrow range in the vicinity of the central part, as shown in FIG. 16. In either case, therefore, the rod target 52 goes to waste. This has made the conventional arts very uneconomic.

SUMMARY OF THE INVENTION

In light of the above-described problems, the object of the present invention is to provide work with a uniform film thickness, and improve the availability of the rod target, thereby preventing the rod target from going to waste.

As technical means for solving the above-described technical problems, the present invention provides a rod target for an arc evaporation source, the rod target employing its outer peripheral surface as an evaporation surface, wherein the opposite ends thereof in the longitudinal direction thereof are each formed thicker than the central part thereof.

In the present invention, the length of the thicker portion at each of the opposite ends of the rod target in the longitudinal direction thereof is preferably set to be not less than 75 mm nor more than 200 mm. In the present invention, the length of the thicker portion affects the uniformity of film thickness and the availability of the rod target, irrespective of the entire length of the rod target.

In the present invention, the ratio of the effective consumed sectional area of the thicker portion at each of the opposite ends of the rod target in the longitudinal direction thereof with respect to the effective consumed sectional area of the narrower portion in the central part thereof is preferably set to be more than 1.0 and not more than 3.0.

In the present invention, the boundary portion between the thicker portion at each of the opposite ends of the rod target in the longitudinal direction thereof and the narrower portion in the central part thereof may be changed in the thickness in a step-by-step manner so that the thickness thereof gradually decreases from the thicker portion at each of the opposite ends thereof in the longitudinal direction thereof toward the narrower portion in the central part thereof.

In the present invention, a taper portion may be provided in the boundary portion between the thicker portion at each of the opposite ends of the rod target in the longitudinal direction thereof and the narrower portion in the central part thereof so that the diameter thereof gradually decreases from each of the thicker portions toward the narrower portion.

Further, the present invention provides a method for manufacturing the rod target for an arc evaporation source as mentioned above, comprising integrally assembling the thicker portion at each of the opposite ends thereof in the longitudinal direction thereof and the narrower portion in the central part thereof, after, at least, separately producing the thicker portion at each of the opposite ends thereof in the longitudinal direction thereof and the narrower portion in the central part thereof.

Still further, the present invention provides an arc deposition device in which a rod target for an arc evaporation source and work are provided in a vacuum vessel, in which a target material is evaporated from the outer peripheral surface of the rod target for an arc evaporation source, and in which the evaporated target material is caused to be adhered to the work. In this arc deposition device, the rod target for an arc evaporation source as mentioned above is used as the rod target for an arc evaporation source provided in the vacuum vessel.

According to the present invention, the work is provided with a uniform film thickness, and the availability of the rod target is improved, whereby waste of the target material is eliminated, resulting in an economic advantage.

DESCRIPTION OF THE PREFERRED EMBODIMENTS

Hereinafter, the present invention will be described with illustrated embodiments.

Figure 3:
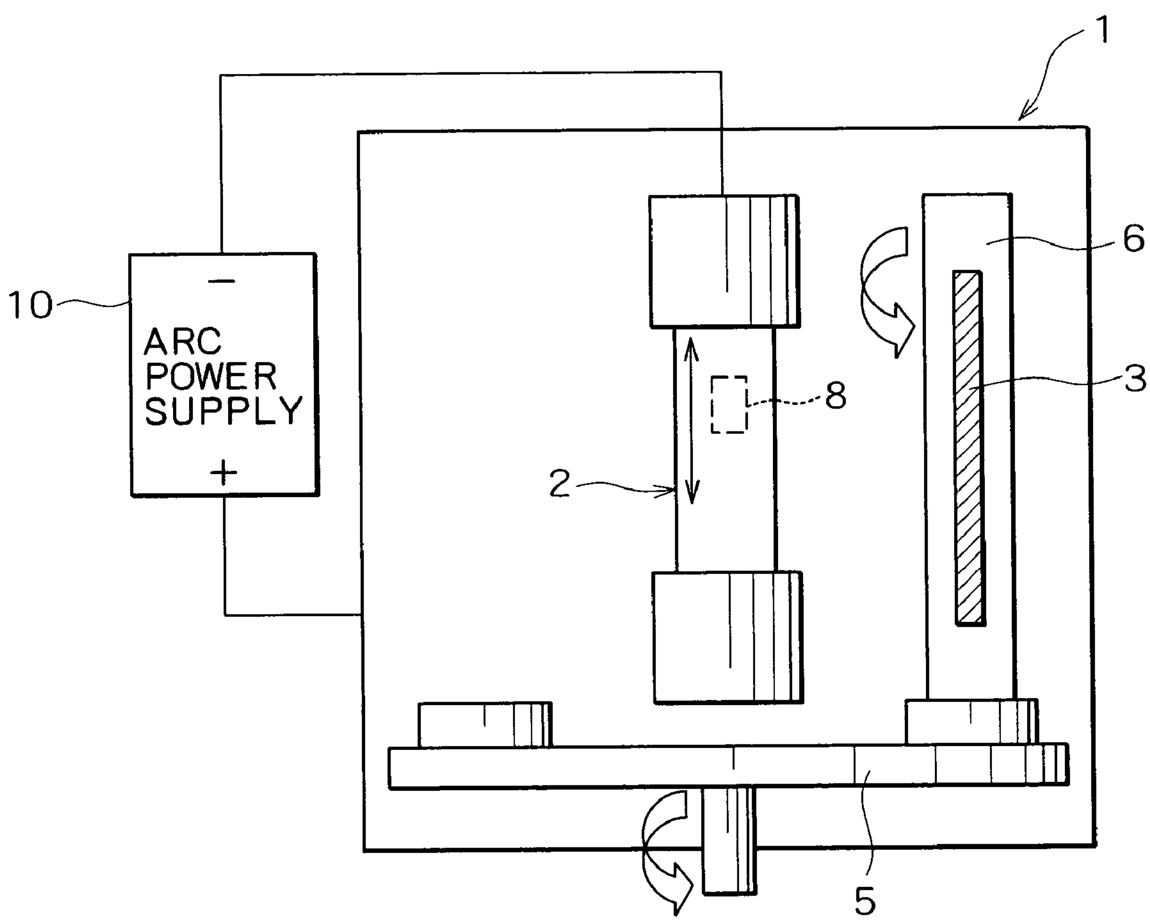
FIG. 3 is a schematic constructional view of an arc evaporation device according to the present invention.

In FIG. 3, a hollow cylindrical rod target 2 for an arc evaporation source and work 3 are provided in a vacuum vessel 1 for a vacuum deposition device.

The rod target 2 is disposed in the central part of the vacuum vessel 1 along the up-and-down direction. A rotational table 5 is provided in a lower portion of the vacuum vessel 1. The rotational table 5 is supported so as to be rotatable about its vertical axis substantially coaxial with the rod target 2. The work 3 is placed on the rotational table 5 through the intermediary of a holding member 6. The work 3 is configured to revolute about the rod target 2 with the rotation of the rotational table 5 and simultaneously to rotate together with the holding member 6 about the vertical axis thereof.

A magnet 8 is provided in the rod target 2 so as to be movable up and down. The cathode of an arc power supply 10 is connected to the top end of the rod target 2. The anode of the arc power supply 10 is connected to the vacuum vessel 1.

In order to form a coating on the work 3 by the vacuum deposition device, the vacuum vessel 1 is first evacuated by a vacuum pump (not shown) to keep the inside of the vacuum vessel in a vacuum state with a predetermined pressure. When a vacuum arc discharge is generated from the rod target 2 by an ignition unit (not shown), an arc spot in which an arc current is concentrated appears on the surface (outer peripheral surface) of the rod target 2. Herein, a target material is evaporated from the outer peripheral surface of the rod target 2 while controlling the position of the arc spot by ascending/descending of the magnet 8.

The vapor of the evaporated target material moves toward the work 3 disposed in the vacuum vessel 1, and forms a coating on the work 3. A negative voltage (bias voltage) is applied to the work 3 by a power supply (not shown) as required, and coating formation is performed while accelerating ions in the vapor. Also, as required, a reactive gas such as nitrogen may be introduced into the vacuum vessel 1 to form a coating comprising a compound of the target material and nitrogen.

Figure 1:
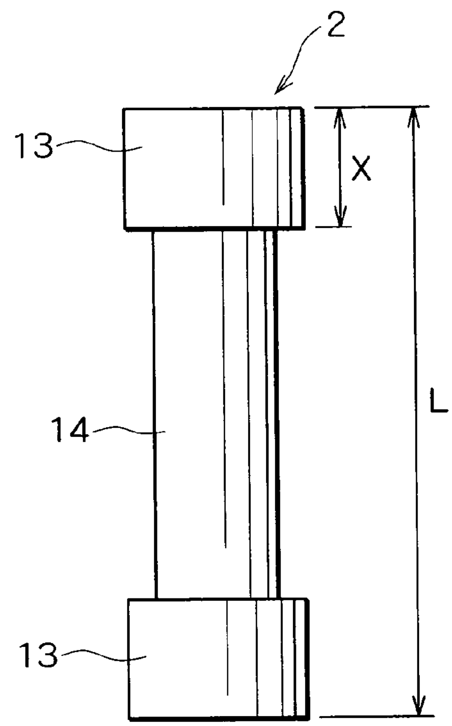
FIG. 1 is a front view of a rod target according to an embodiment of the present invention.
Figure 2:
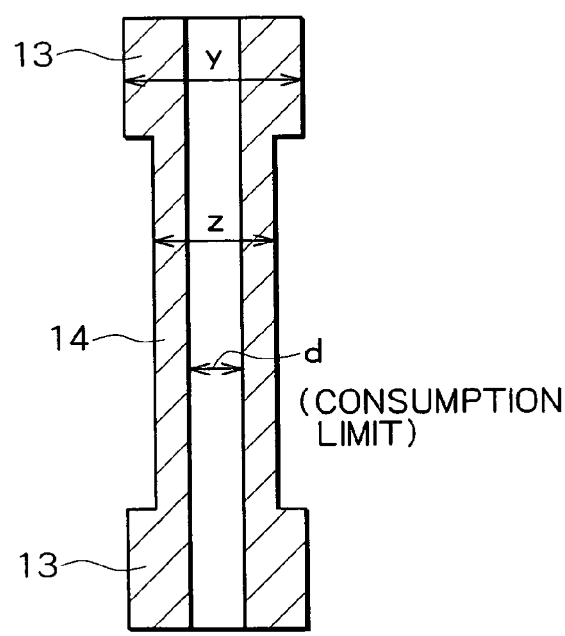
FIG. 2 is a front sectional view of the rod target.

As shown in FIGS. 1 and 2, in the rod target 2 for an arc evaporation source, the opposite ends thereof in the longitudinal direction thereof are formed thicker than the central part thereof. Namely, a thicker portion (larger diameter portion) 13 is provided at each of the opposite ends of the rod target 2 in the longitudinal direction thereof, and a narrower portion (smaller diameter portion) 14 is provided in the central part thereof.

The length x of the thicker portion 13 at each of the opposite ends of the target rod 2 in the longitudinal direction thereof is set to be not less than 75 mm nor more than 200 mm, and is preferably set to 100 to 150 mm.

The ratio of the effective consumed sectional area of the thicker portion at each of the opposite ends of the target rod 2 in the longitudinal direction thereof with respect to the effective consumed sectional area of the narrower portion in the central part thereof is set to be more than 1.0 and not more than 3.0, and is preferably set to 1.5 to 2.5.

Here, as shown in FIG. 2, if we let the outer diameter of each of the larger diameter portions 13 of the rod target 2 be y, and that of the smaller diameter portion 14 be z, and the inner diameter of the rod target 2 (i.e., the consumption limit thereof) be d, then the effective consumed sectional areas Sy and Sz, respectively, of the larger portion 13 and the smaller diameter portion 14, are represented by the following expressions, respectively.

$$Sy=(y/2)^2\cdot\pi-(d/2)^2\cdot\pi$$

$$Sz=(z/2)^2\cdot\pi-(d/2)^2\cdot\pi$$

Therefore, the Sy/Sz ratio is set to be in the followingrange.

$$1.0<Sy/Sz\leqq 3.0$$

Meanwhile, in FIG. 1, L denotes the entire length of the target. L can be 700 mm, for example.

According to the above-described embodiment, the following effects are produced.

(1) When the amount of evaporation from the ends of the rod target 2 is increased to obtain a uniform film thickness distribution on the work 3, the availability of the rod target is improved, and thereby waste is eliminated.

(2) The utilization efficiency of the rod target 2 is improved.

Specifically, the length of each of the opposite ends of the rod target 2, which needs to be increased in the evaporation amount in order to meet a general requirement that variations in the thickness of a film formed on the work 3 should be within ±5%, is restricted, and is not subjected to an influence of the entire length of the target. That is, by limiting the length of the thicker portion at each of the ends of the rod target to a necessary and sufficient length, the utilization efficiency of the rod target 2 is improved. If each of the larger diameter portions 13 is longer than necessary, the excessive part thereof is left over. Conversely, each of the larger diameter portions 13 is shorter than necessary, each of the end sides of the rod target unfavorably early arrives at its consumption limit. In either case, the utilization efficiency decreases.

(3) The utilization efficiency of the rod target 2 is improved.

Specifically, as in the case described in (2), the evaporation amount to be increased at each of the ends of the rod target 2 in order to fulfill the requirement that variations in the film thickness should be within 5%, is restricted. If a necessary and sufficient consumed amount (by target diameter) is secured, it is possible to improve the utilization efficiency, and simultaneously increase the overall amount of evaporation source (i.e., usable volume). With the target diameter larger than necessary, each of the larger diameter portions 13 becomes surplus when the smaller diameter portion 14 arrives at its consumption limit, thereby reducing the utilization efficiency. Conversely, with the target diameter smaller than necessary, each of the ends (larger diameter portions 13) unfavorably early arrives at its consumption limit, thereby reducing the overall amount of evaporation source.

Figure 4:
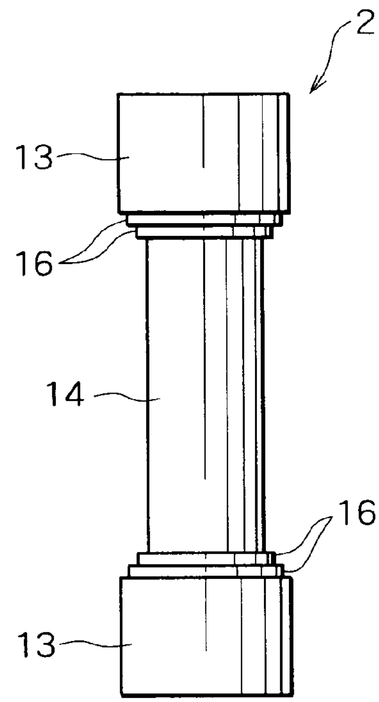
FIG. 4 is a front view of a rod target according to another embodiment of the present invention.
Figure 5:
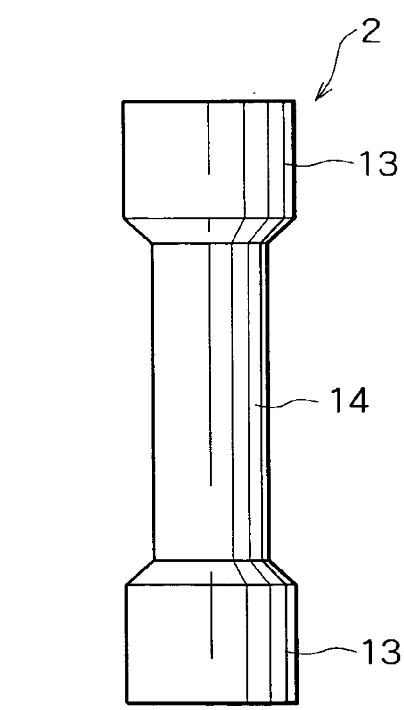
FIG. 5 is a front view of a rod target according to still another embodiment of the present invention.
Figure 6:
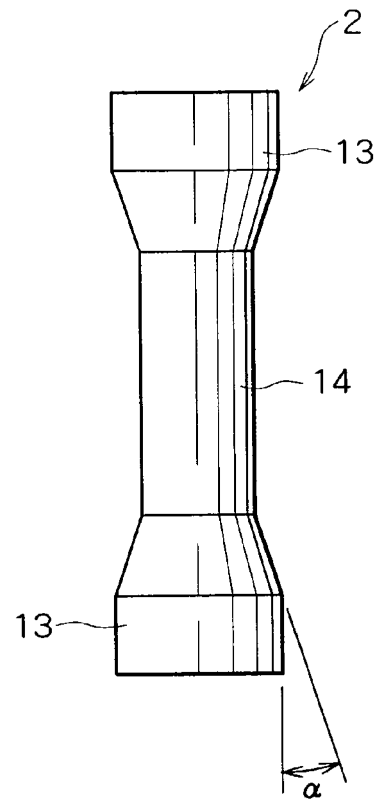
FIG. 6 is a front view of a rod target according to a further embodiment of the present invention.

FIGS. 4 to 6 each show another embodiment. In the embodiment shown in FIG. 4, many minute steps 16 are provided in the boundary portion between the thicker portion 13 of each of the opposite ends of the rod target 2 in the longitudinal direction thereof and the narrower portion 14 in the central part thereof, whereby the boundary portion between the thicker portion 13 of each of the opposite ends thereof in the longitudinal direction thereof and the narrower portion 14 in the central part thereof is changed in the thickness in a step-by-step manner so that the thickness thereof gradually decreases from each of the thicker portions 13 toward the narrower portion 14.

In the embodiment shown in FIG. 5, a taper portion 17 is provided in the boundary portion between the thicker portion 13 at each of the opposite ends of the rod target 2 in the longitudinal direction thereof and the narrower portion 14 in the central part thereof so that the diameter thereof gradually decreases from each of the thicker portions 13 toward the narrower portion 14.

In the embodiment shown in FIG. 6, as in the case of the embodiment shown in FIG. 5, taper portions 17 are provided, and the tilt angle $\alpha$ of each of the taper portions is set to be not less than 3 degrees nor more than 30 degrees. Preferably, the tilt angle $\alpha$ is set to 5 to 15 degrees.

According to the embodiments shown in FIGS. 4 to 6, the following effects are produced in addition to the above-described effects described in (1), (2) and (3).

(4) With regard to the surface perpendicular to an ordinary discharge surface, it differs in its positional relationship with the anode (positive pole) from that of the ordinary discharge surface; the anode is unfavorably difficult to see therefrom; and the magnetic field configuration thereof with respect to its discharge surface differs to a large degree from that of the ordinary discharge surface. As a result, if the surface perpendicular to the ordinary discharge surface is caused to discharge over a long period of time, an accident fire is apt to occur therefrom. Therefore, changing the target diameter in a step-by-step manner makes it possible to prevent the occurrence of an accident fire when an arc spot transfers to regions in which the target diameter varies.

Figure 7:
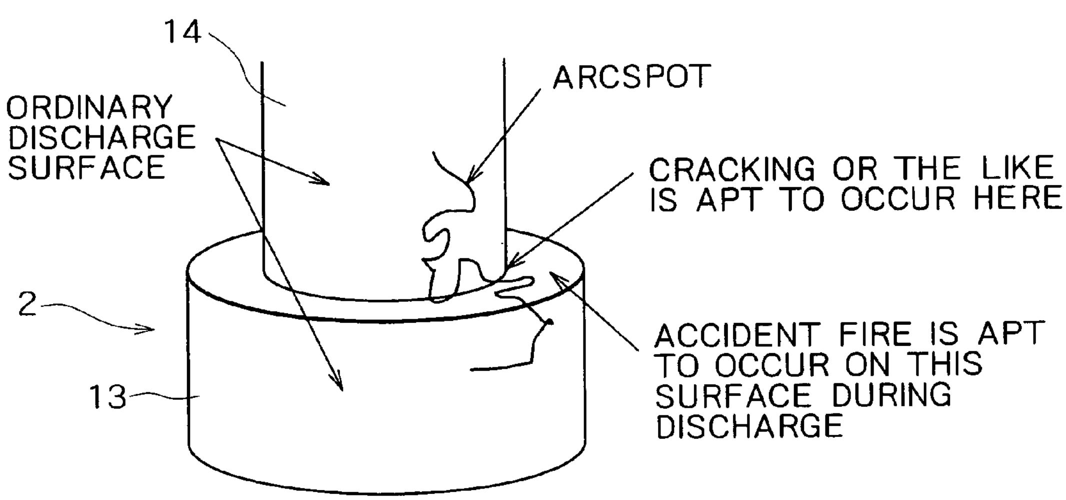
FIG. 7 is a perspective view of a rod target, wherein effects of the rod target are illustrated.

As shown in FIG. 7, at spots where the diameter steeply changes, cracking or the like of the rod target 2 is apt to occur due to the concentration of thermal stress by an arc discharge. The occurrence of cracking can be prevented by changing the diameter of the rod target 2 in a step-by-step manner.

(5) Thereby, the transfer of the arc spot to regions in which the target diameter varies becomes more smooth, and by avoiding the concentration of thermal stress on edge portions, cracking becomes less prone to occur.

(6) The consumption shape of the boundary region in which the target diameter varies becomes smoothed.

Unlike the case where a surface discharge is performed from the entire surface of a target as in a sputtering method, in the arc evaporation source, an arc spot irregularly moves on the surface of the target. As a result, in the arc evaporation source, specific problems such as the occurrence of an accident fire and the concentration of thermal stress at spots in which the diameter varies, tend to occur. However, according to the embodiments shown in FIGS. 4 to 6, there is no risk of incurring such problems.

Figure 8:
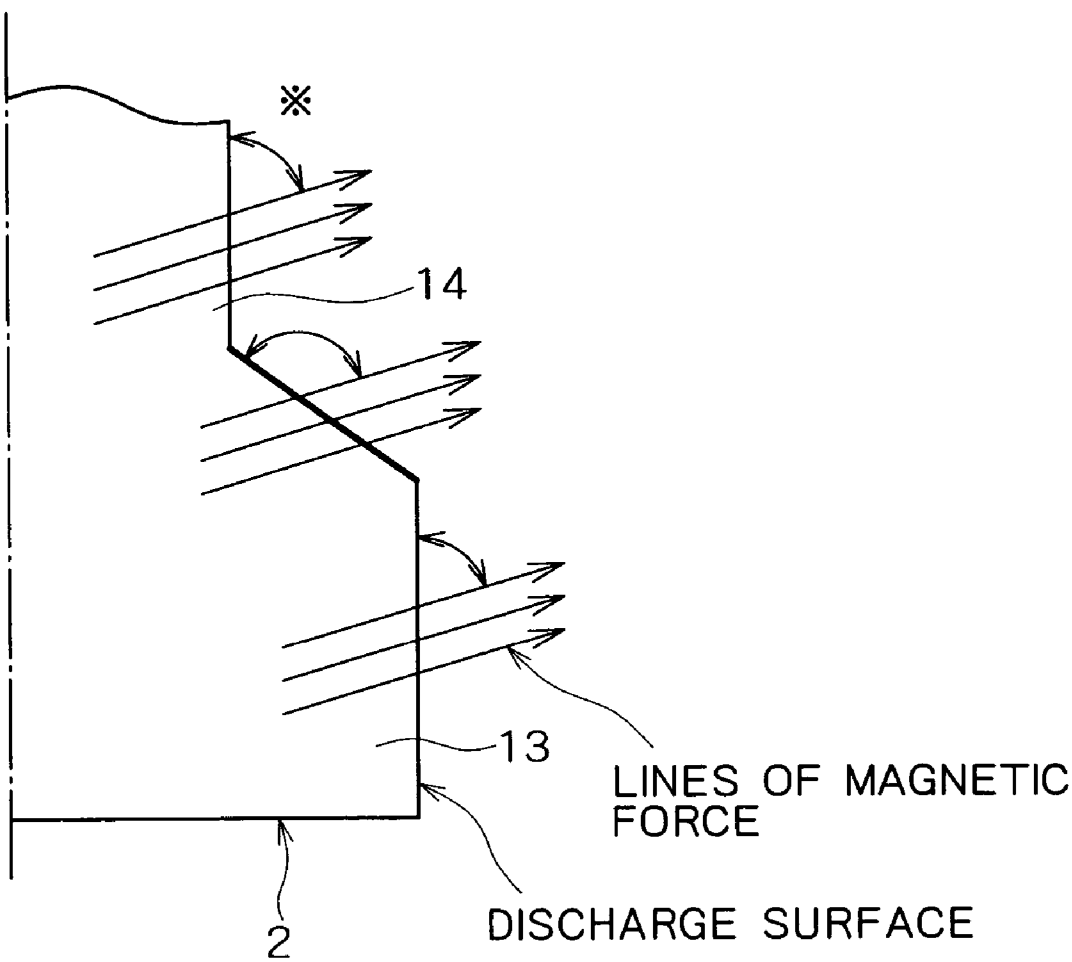
FIG. 8 is a front view of a rod target, wherein effects of the rod target are illustrated.

Specifically, as shown in FIG. 8, the behavior of an arc spot when a magnetic field is applied, strongly depends upon the angle formed between the discharge surface of the rod target 2 and each line of magnetic force therethrough. Therefore, with a magnetic field applied, on each of the taper portions 17 (the thick line portion in FIG. 8) having a large tilt angle $\alpha$, the arc spot exhibits a specific behavior. For example, in the portion other than the taper portions 17, the arc spot is uniformly distributed in a certain range, whereas in each of the taper portions 17, a phenomenon occurs such that the arc spot unfavorably concentrates on either of the two opposed edges of each of the taper portions 17.

Accordingly, by reducing the tilt angle $\alpha$ to thereby get the relative angle between each line of magnetic force and the discharge surface of each of the taper portions 17 closer to that in the portion other than the taper portions 17, it is possible to avoid an undesirable arc behavior. From this viewpoint, the smaller the tilt angle $\alpha$, the more desirable the arc behavior is. However, in order to optimize the length and diameter of the larger diameter portion 13, the tilt angle $\alpha$ is naturally subjected to constraints.

Figure 9:
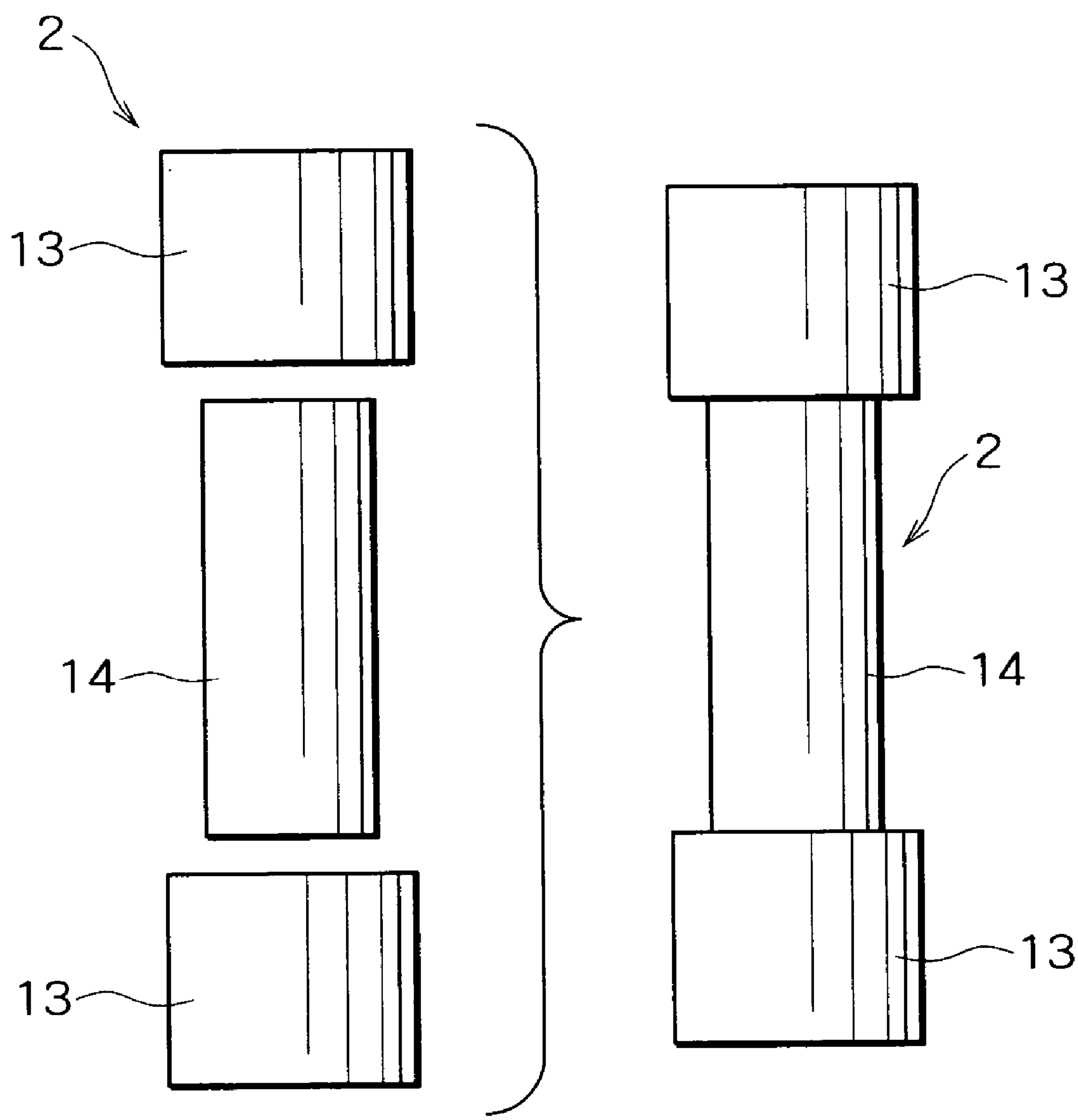
FIG. 9 is a front view of a rod target according to a yet further embodiment of the present invention.

FIG. 9 shows another embodiment. According to this embodiment, a rod target 2 is formed by, at least, separately producing the large diameter portion 13 at each of the opposite ends thereof in the longitudinal direction thereof and the narrower portion 14 in the central part thereof, and thereafter integrally assembling the large diameter portion 13 at each of the opposite ends in the longitudinal direction thereof and the narrower portion 14 in the central part thereof.

According to the embodiment shown in FIG. 9, the following effects are produced in addition to the above-described effects described in (1), (2), (3), (4), (5), and (6).

(7) In general, the rod target 2 is formed by molding of powder of an evaporating material by a hot isostatic pressing (HIP) method, and then processing it into a desired ultimate shape. However, for the rod target 2 according to the present invention, it is very difficult to perform HIP processing into a shape close to the ultimate shape. This is because, not only the design of a capsular shape is very difficult but also there is a very high risk of causing a fracture or the like of the capsule during the HIP processing. Therefore, after HIP processing the rod target 2 into a simple solid cylindrical shape with the diameter in keeping with the larger diameter portion 13, the central part must be cut away. This results in very much portion of the central part being scrapped. Accordingly, each of the larger diameter portions 13 and the smaller diameter portion 14 are individually processed as a simple solid cylindrical shape, and after processing them into respective desired diameters, the larger diameter portions 13 and the smaller diameter portion 14 are integrally coupled, whereby waste can be eliminated.

The manufacturing method for the rod target 2 shown in FIG. 9 can be applied not only to the rod target 2 according to the embodiments shown in FIGS. 1 and 2, but also to the rod target 2 according to the embodiments shown in FIGS. 4 to 6. In this case, in addition to the larger diameter portions 13 and the smaller diameter portion 14, the boundary portion (steps 16 and taper portion 17) between each of the larger diameter portions 13 and the smaller diameter portion 14 may also be separately produced, and thereafter all of these may be integrally coupled.

Next, descriptions will be made of the results of the tests performed with respect to the rod target 2 according to the present invention.

TEST EXAMPLE 1

Table 1 shows the target consumption amount (volume), and the consumption efficiency (up to the limit consumption), i.e., (the volume consumed or evaporated until the lifetime expires)÷(the initial volume), when the length x of the larger diameter portion 13 of the rod target is varied, using a rod target having the entire length L of 700 mm, the outer diameter z of its smaller diameter portion 14 of 100 mm, and the outer diameter y of its larger diameter portion 13 of 125 mm. Variations in the film thickness distribution was maintained within ±5%, and the target consumption limit was set to Φ70 mm. As a result, the consumption efficiency was higher when the length x of the larger diameter portion 13 was 100 to 150 mm, and was the highest when the length x of the larger diameter portion 13 was 125 mm. The length x of the larger diameter portion 13 that allows the consumption efficiency to be the maximum, somewhat depends upon the distance between the rod target 2 and the work 3, or the like. However, irrespective of the difference in the distance between the rod target 2 and the work 3, substantially the same consumption efficiency tendency was observed, and the consumption efficiency was optimum when the length x of the larger diameter portion 13 is in the neighborhood of 150 mm.

TABLE 1

| Length of larger diameter portion | Initial effective Volume | Consumed (evaporated) volume | Consumption efficiency |
|---|---|---|---|
| 250 mm | 7222 $cm^3$ | 3004 $cm^3$ | 41.6% |
| 225 mm | 6780 $cm^3$ | 3004 $cm^3$ | 44.3% |
| 200 mm | 6338 $cm^3$ | 3004 $cm^3$ | 47.4% |
| 175 mm | 5896 $cm^3$ | 3004 $cm^3$ | 50.9% |
| 150 mm | 5454 $cm^3$ | 3004 $cm^3$ | 55.1% |
| 125 mm | 5012 $cm^3$ | 3004 $cm^3$ | 59.9% |
| 100 mm | 4572 $cm^3$ | 2524 $cm^3$ | 55.2% |
| 75 mm | 4130 $cm^3$ | 1664 $cm^3$ | 40.3% |
| 50 mm | 3688 $cm^3$ | 1524 $cm^3$ | 41.3% |

TEST EXAMPLE 2

Table 2 shows the consumption efficiency of the rod target 2 when the outer diameter y of the large diameter portion 13 thereof is varied, with the length of the large diameter portion 13 set to 125 mm.

As can be seen from Table 2, the smaller the outer diameter y of the large diameter portion 13, the higher the consumption efficiency was. However, when the outer diameter y of the larger diameter portion 13 becomes below 120 mm, the consumption efficiency peaks out, and the consumable amount steeply decreases as a matter of course. After all, by setting the ratio of the effective consumed sectional area of each of the larger diameter portion 13 with respect to that of the smaller diameter portion 14 is set to 1.5 to 2.5, it was possible to maximize a consumption amount while achieving a high consumption coefficient.

TABLE 2

| Diameter of larger diameter portion | Ratio of effective consumed sectional areas (larger diameter portion/smaller diameter portion) | Initial effective volume | Consumed (evaporated) volume | Consumption efficiency |
|---|---|---|---|---|
| 110 mm | 1.41 | 3628 $cm^3$ | 2270 $cm^3$ | 62.6% |
| 115 mm | 1.63 | 4070 $cm^3$ | 2462 $cm^3$ | 60.5% |
| 120 mm | 1.86 | 4532 $cm^3$ | 2828 $cm^3$ | 62.4% |
| 125 mm | 2.10 | 5012 $cm^3$ | 3004 $cm^3$ | 59.9% |
| 130 mm | 2.35 | 5514 $cm^3$ | 3004 $cm^3$ | 54.5% |
| 135 mm | 2.61 | 6034 $cm^3$ | 3004 $cm^3$ | 49.8% |
| 140 mm | 2.88 | 6574 $cm^3$ | 3004 $cm^3$ | 45.7% |
| 145 mm | 3.16 | 7134 $cm^3$ | 3004 $cm^3$ | 42.1% |
| 150 mm | 3.45 | 7712 $cm^3$ | 3004 $cm^3$ | 39.0% |

TEST EXAMPLE 3

Figure 10:
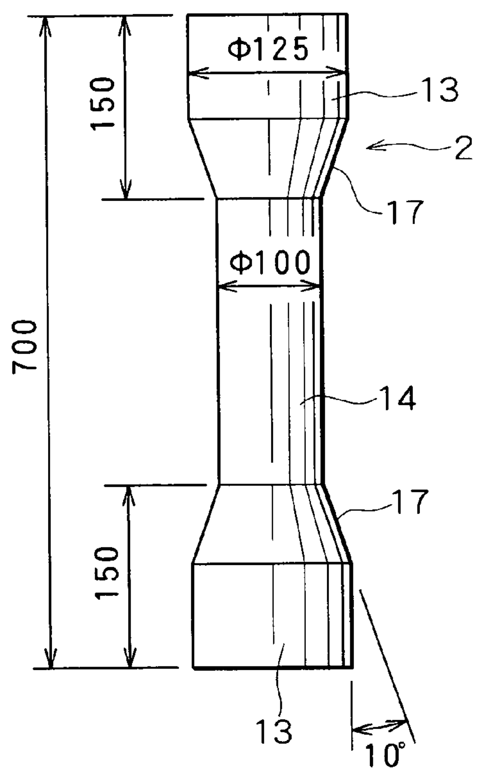
FIG. 10 is a front view of a test example of a rod target in its initial state.
Figure 11:
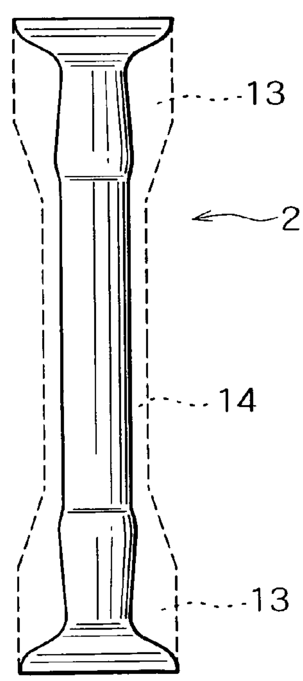
FIG. 11 is a front view of the test example of the rod target in its consumed state.
Figure 12:
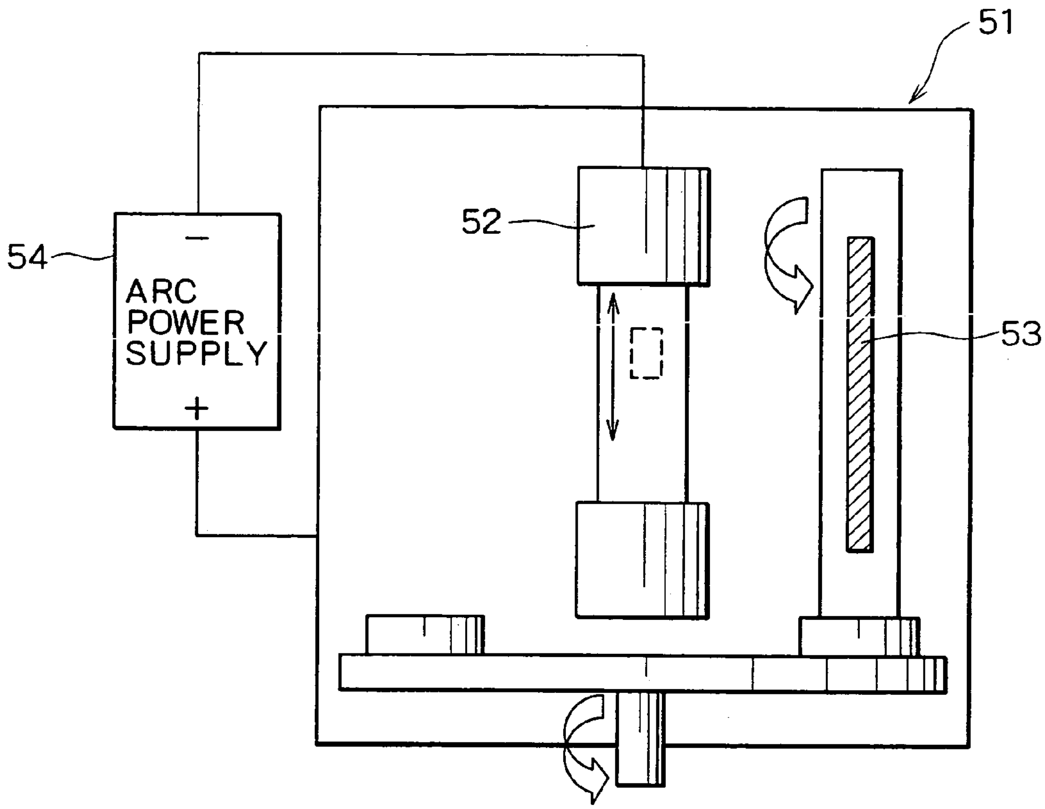
FIG. 12 is a schematic constructional view of a conventional arc evaporation device.
Figure 13:
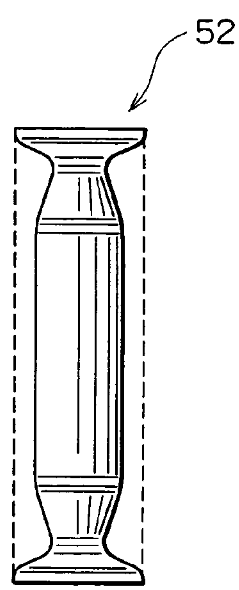
FIG. 13 is a front view of a conventional rod target.
Figure 14:
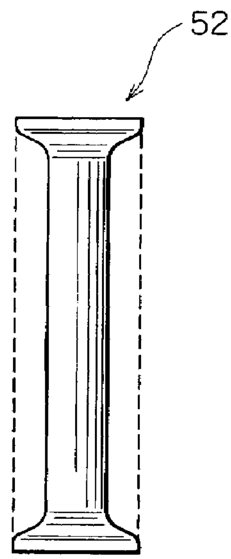
FIG. 14 is a front view of the conventional rod target.
Figure 15:
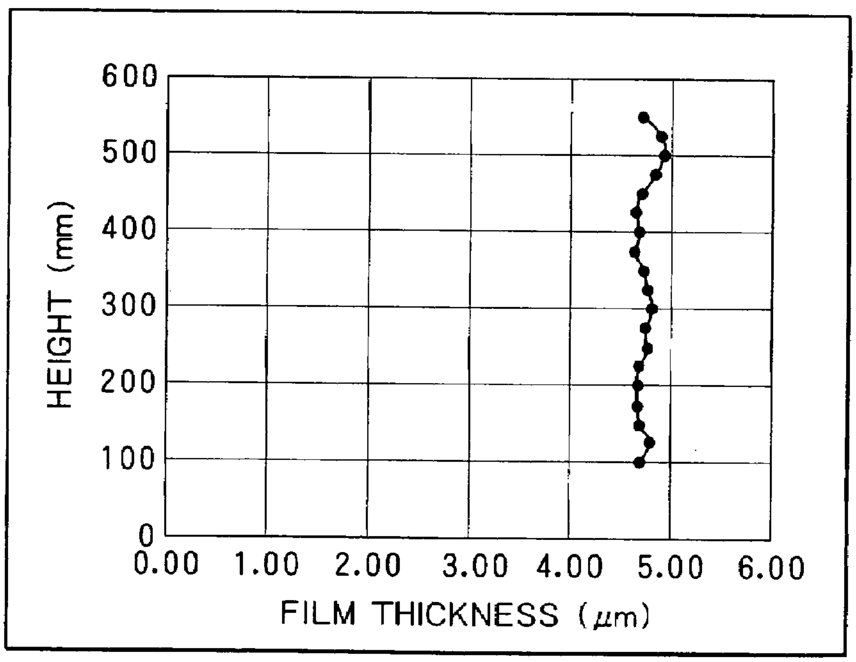
FIG. 15 is a diagram of a distribution of film thickness.
Figure 16:
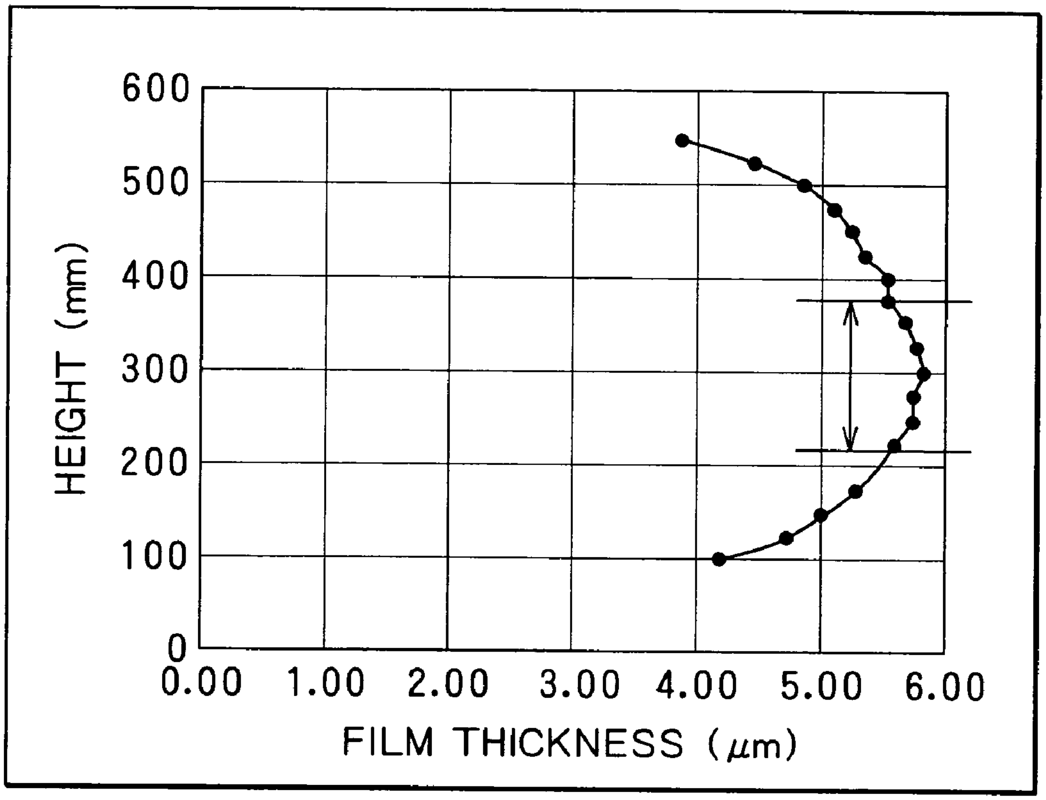
FIG. 16 is a diagram of another distribution of film thickness.

When the film thickness distribution shown in FIG. 15 was obtained with the initial state of the rod target 2 set as shown in FIG. 10, the consumed target assumed a shape as illustrated in FIG. 11.

Meanwhile, in the above-described embodiment, as the rod target 2, a hollow cylindrical one was used. However, the shape of the rod target 2 is not limited to a hollow cylindrical one. A solid cylindrical shape may be used, or alternatively a hollow elliptic cylindrical shape or a solid elliptic cylindrical shape may also be adopted.

What is claimed is:

1. A rod target for an arc evaporation source, said rod target employing its outer peripheral surface as an evaporation surface, wherein the opposite ends of said rod target in the longitudinal direction of said rod target are each formed thicker than the central part of said rod target, wherein a taper portion is provided in a boundary portion between the thicker portion at opposite ends of said rod target in the longitudinal direction of said rod target and the narrower portion in the central part of said rod target so that the diameter of said rod target gradually decreases from each of the thicker portions toward the narrower portion, wherein a tilt angle of the taper portion is set to be not less than 3 degrees nor more than 30 degrees.

2. An arc deposition device in which a rod target for an arc evaporation source and work are provided in a vacuum vessel, in which a target material is evaporated from the outer peripheral surface of the rod target for an arc evaporation source, and in which the evaporated target material is caused to adhere to the work, wherein the rod target for an arc evaporation source as recited in claim 1 is used as the rod target for an arc evaporation source provided in the vacuum vessel.

3. A rod target for an arc evaporation source, said rod target employing its outer peripheral surface as an evaporation surface, wherein the opposite ends of said rod target in the longitudinal direction of said rod target are each formed thicker than the central part of said rod target, wherein the length of the thicker portion at each of the opposite ends of said rod target in the longitudinal direction of said rod target is set to be not less than 75 mm nor more than 200 mm.

4. An arc deposition device in which a rod target for an arc evaporation source and work are provided in a vacuum vessel, in which a target material is evaporated from the outer peripheral surface of the rod target for an arc evaporation source, and in which the evaporated target material is caused to adhere to the work, wherein the rod target for an arc evaporation source as recited in claim 3 is used as the rod target for an arc evaporation source provided in the vacuum vessel.

5. A rod target for an arc evaporation source, said rod target employing its outer peripheral surface as an evaporation surface, wherein the opposite ends of said rod target in the longitudinal direction of said rod target are each formed thicker than the central part of said rod target, wherein the ratio of the effective consumed sectional area of the thicker portion at each of the opposite ends of said rod target in the longitudinal direction of said rod target with respect to the effective consumed sectional area of the narrower portion in the central part of said rod target is set to be more than 1.0 and not more than 3.0.

6. An arc deposition device in which a rod target for an arc evaporation source and work are provided in a vacuum vessel, in which a target material is evaporated from the outer peripheral surface of the rod target for an arc evaporation source, and in which the evaporated target material is caused to adhere to the work, wherein the rod target for an arc evaporation source as recited in claim 5 is used as the rod target for an arc evaporation source provided in the vacuum vessel.

7. A rod target for an arc evaporation source, said rod target employing its outer peripheral surface as an evaporation surface, wherein the opposite ends of said rod target in the longitudinal direction of said rod target arc each formed thicker than the central part of said rod target, wherein a boundary portion between the thicker portion at each of the opposite ends of said rod target in the longitudinal direction of said rod target and the narrower portion in the central part of said rod target is changed in the thickness in a step-by-step manner so that the thickness of said rod target gradually decreases from the thicker portion at each of the opposite ends of said rod target in the longitudinal direction of said rod target toward the narrower portion in the central part of said rod target.

8. An arc deposition device in which a rod target for an arc evaporation source and work are provided in a vacuum vessel, in which a target material is evaporated from the outer peripheral surface of the rod target for an arc evaporation source, and in which the evaporated target material is caused to adhere to the work, wherein the rod target for an arc evaporation source as recited in claim 7 is used as the rod target for an arc evaporation source provided in the vacuum vessel.

9. A method for manufacturing said rod target for an arc evaporation source, said rod target employing its outer peripheral surface as an evaporation surface, wherein the opposite ends of said rod target in the longitudinal direction of said rod target are each formed thicker than the central part of said rod target, comprising integrally assembling the thicker portion at each of the opposite ends of said rod target in the longitudinal direction of said rod target and the narrower portion in the central part of said rod target, after, at least, separately producing the thicker portion at each of the opposite ends of said rod target in the longitudinal direction of said rod target and the narrower portion in the central part of said rod target.

10. A rod target for an arc evaporation source, said rod target employing its outer peripheral surface as an evaporation surface, wherein the opposite ends of said rod target in the longitudinal direction of said rod target are each formed thicker than the central part of said rod target, wherein a taper portion is provided in a boundary portion between the thicker portion at each of the opposite ends of said rod target in the longitudinal direction of said rod target and the narrower portion in the central part of said rod target so that the diameter of said rod target gradually decreases from each of the thicker portions toward the narrower portion, wherein a tilt angle of the taper portion is predetermined to be not less than 3 degrees nor more than 30 degrees.

11. A rod target for an arc evaporation source, said rod target employing its outer peripheral surface as an evaporation surface, wherein the opposite ends of said rod target in the longitudinal direction of said rod target are each formed thicker than the central part of said rod target, wherein the length of the thicker portion at each of the opposite ends of said rod target in the longitudinal direction of said rod target is predetermined to be not less than 75 mm nor more than 200 mm.

* * * * *